United States Patent
Huynh et al.

(10) Patent No.: US 7,932,844 B1
(45) Date of Patent: Apr. 26, 2011

(54) CIRCUITS AND METHODS FOR CALIBRATING A FREQUENCY RESPONSE OF A FILTER

(75) Inventors: Thien Huynh, Etoy (CH); Philippe Mosch, Le Mont-sur-Lausanne (CH); Patrick Clement, Belmont (CH)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 12/542,504

(22) Filed: Aug. 17, 2009

Related U.S. Application Data

(60) Provisional application No. 61/090,112, filed on Aug. 19, 2008.

(51) Int. Cl.
*H03M 1/10* (2006.01)
(52) U.S. Cl. .......................................... 341/120; 341/155
(58) Field of Classification Search .............. 455/307, 455/306; 375/227; 341/120, 155, 118
See application file for complete search history.

(56) References Cited

U.S. PATENT DOCUMENTS

| 6,983,136 B2 * | 1/2006 | Mason et al. ............... 455/307 |
| 7,515,078 B2 * | 4/2009 | May ............................. 341/143 |

* cited by examiner

*Primary Examiner* — Brian Young

(57) ABSTRACT

In one embodiment, the present invention includes an integrated circuit comprising a radio frequency communication channel having a mixer and a programmable analog filter coupled to an output terminal of the mixer. The integrated circuit further comprises a digital-to-analog converter providing an AC signal to the digitally programmable analog filter, an analog-to-digital converter (ADC) coupled to an output terminal of the digitally programmable analog filter, and a digital calibration circuit that adjusts the filter frequency according to measurements calculated from the data from the ADC. During a first calibration phase, the filter frequency is adjusted to a first frequency and a first signal is measured. During a second calibration phase, the filter frequency is adjusted to a second frequency approximately equal to a frequency of the AC signal, and a second signal is measured. The filter frequency is further adjusted based on measured values of the first and second signals.

17 Claims, 7 Drawing Sheets

CIRCUITS AND METHODS FOR CALIBRATING A FREQUENCY RESPONSE OF A FILTER

CROSS REFERENCE TO RELATED APPLICATIONS

This application claims the benefit of priority from U.S. Provisional Application No. 61/090,112, filed Aug. 19, 2008, the disclosure of which is incorporated herein by reference.

BACKGROUND

The present invention relates to calibration of electronic circuits, and in particular, to circuits and methods for calibrating the frequency response of a filter.

Some electronic circuits use reactive elements to provide a frequency response. For example, analog filters may have inductors and/or capacitors which react to the frequencies of a signal to provide corresponding frequency responses. In the case of a low pass filter, the capacitor may be coupled to an input signal through a resistor. As a frequency of the signal increases, the capacitor may change impedance and provide attenuation. At a characteristic corner frequency, the signal may be attenuated to half its original power. Signals with frequencies much higher than the corner frequency may be attenuated such that the signals are essentially removed from the output signal.

Analog filters remove unwanted portions of signals. Analog filters include low pass, high pass, and band pass filters. Depending on the application, a different filter type may be implemented. For example, communication systems have circuits which mix signals together in order to modulate and demodulate. The mixers provide extraneous signals which can be removed by an analog filter.

Many communication systems include digitally programmable filtering as well as analog and digital signal processing. The frequency response of the filter can be modified by altering some of the component values in the analog filter circuit. For example, for frequencies between 100 khz and 100 Mhz, a low pass filter include capacitors that may be digitally controlled to provide a range of frequency adjustment, for example.

Accurate adjustment of digitally programmable filters affects system performance. However, many times the capacitors or other filter components may exhibit a significant spread in value. For example, a metal-oxide-metal (MOM) thin-film capacitor and poly resistors may be manufactured on the same integrated circuit and exhibit an overall tolerance beyond 30%. Acceptable performance for a communication system may require a 1% tolerance.

Traditional methods of calibrating the frequency response of a filter typically require specialized analog circuits. However, such analog circuits take up large die area and may not provide the calibration accuracy desired. Calibration implemented during final testing may be expensive and may not take into account the variances of values due to drift or temperature during normal operation.

SUMMARY

Embodiments of the present invention improve circuit and method of calibrating a frequency response. In one embodiment the present invention includes an integrated circuit comprising a communication channel comprising a digitally programmable analog filter and an analog-to-digital converter coupled in series. The digitally programmable analog filter has a filter frequency. A digital calibration circuit generates a first signal coupled to an analog input of the digitally programmable analog filter and changes the filter frequency of the digitally programmable analog filter between at least two filter frequencies to perform at least a first measurement and a second measurement of the first signal at an output of the analog-to-digital converter. The calibration circuit adjust the filter frequency of the digitally programmable analog filter based on the first measurement and the second measurement.

The following detailed description and accompanying drawings provide a better understanding of the nature and advantages of the present invention.

DETAILED DESCRIPTION

Described herein are techniques for circuit and method of calibrating a frequency response. In the following description, for purposes of explanation, numerous examples and specific details are set forth in order to provide a thorough understanding of the present invention. It will be evident, however, to one skilled in the art that the present invention as defined by the claims may include some or all of the features in these examples alone or in combination with other features described below, and may further include modifications and equivalents of the features and concepts described herein.

Figure 1:
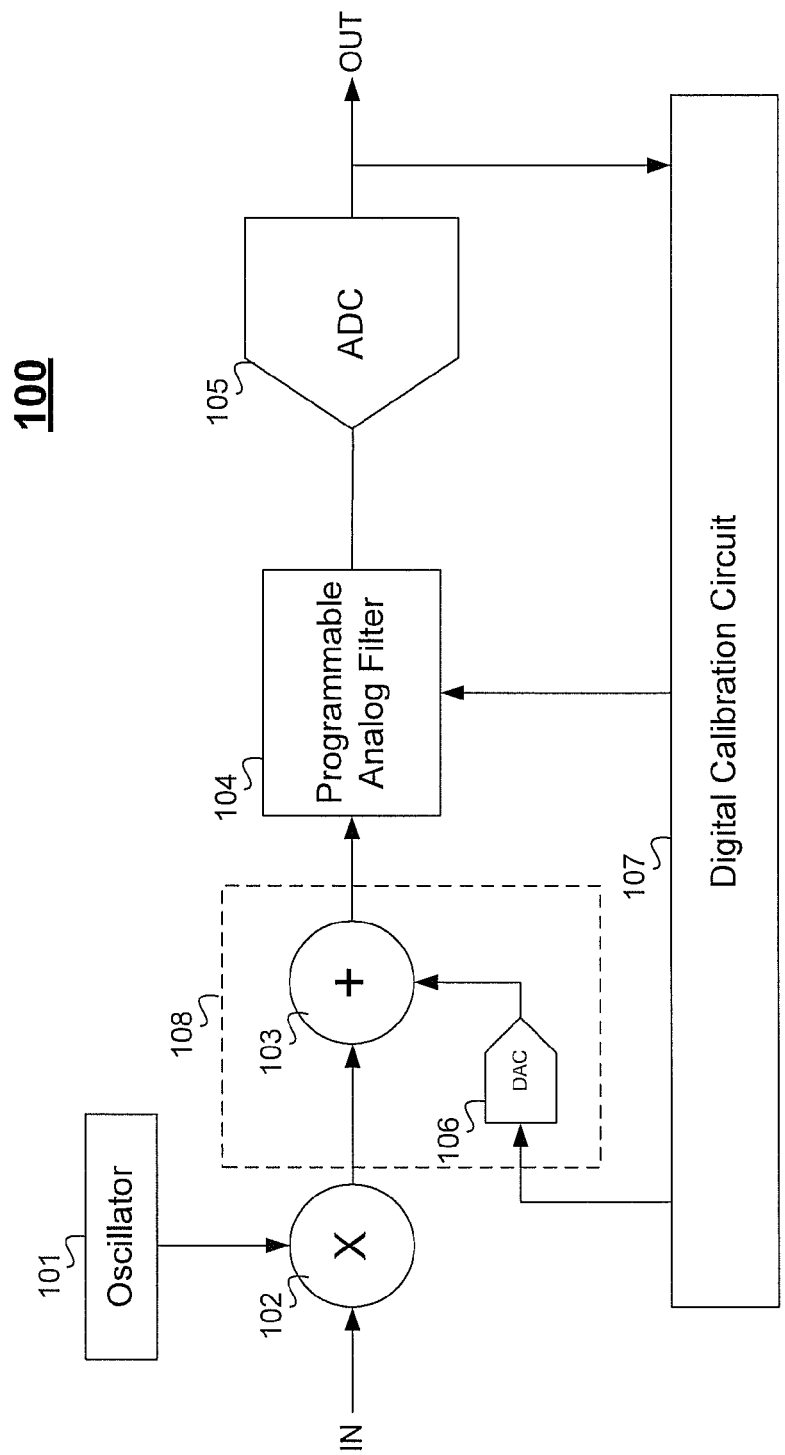
FIG. 1 illustrates a circuit according to one embodiment of the present invention.

FIG. 1 illustrates a circuit 100 according to one embodiment of the present invention. Circuit 100 includes oscillator 101, mixer 102, digital-to-analog converter (DAC) 106, analog filter 104, analog-to-digital converter (ADC) 105, and digital calibration circuit 107. Oscillator 101, mixer 102, digital-to-analog converter (DAC) 106, analog filter 104, and analog-to-digital converter (ADC) 105 make up elements of a radio frequency (RF) communication receiver. Analog filter 104 can be a digitally programmable analog filter. Digital calibration circuit 107 is coupled with DAC 106, analog filter 104, and ADC 105 to calibrate analog filter 104 to a target filter frequency.

Digital calibration circuit 107 can be implemented as a finite state machine, for example. Each calibration can utilize a measurement state machine in the calibration circuit that may be reused for calibrating analog filter 104 to a target filter frequency. Each calibration can reuse the measurement state machine designating different parameters and different storage registers. The parameters can include timing and algorithm selection as described below.

In one mode, circuit 100 is receiving analog signal IN at one input terminal of mixer 102. Mixer 102 multiplies signal IN using a signal from oscillator 101 and provides a product signal to node 103 (e.g., a current summing node). Node 103 and DAC 106 function as a DC compensation circuit 108 and can provide an offset voltage to set the DC level of the signal at the output of the mixer. This offset centers the product signal within the analog range of the signal path in order to use more of the dynamic range of the analog filter 104 and ADC 105, for example. Extraneous signals are removed by analog filter 104, and ADC 105 converts the output of analog filter 104 to a digital signal OUT. The digital signal OUT can be further digitally processed by a processor such as a DSP (digital signal processor), for example. The above described mode of receiving and processing an RF signal in the communication channels is the normal operation of the system.

In an alternate mode, circuit 100 can be configured to calibrate the frequency response of analog filter 104. This is referred to herein as the calibration mode (or just calibration). The product signal provided by mixer 102 may be muted during this mode such that no signal is provided from mixer 102. In one embodiment, the oscillator is turned off such that no signal is provided from mixer 102.

During calibration, an AC signal is produced by DC compensation circuit 108. Digital calibration circuit 107 provides a digital representation of a signal to DAC 106 to generate an analog representation of the signal. Digital calibration circuit 107 can also adjust the filter frequency of analog filter 104 during calibration, and the magnitude of the AC signal at the output of the analog filter 104 can be changed depending on the adjustment of the filter frequency. ADC 105 converts the resulting analog signal to digital signal OUT, and digital calibration circuit 107 measures the resulting signal to determine further adjustments of the filter frequency of the analog filter 104. Embodiments of the present invention may change the filter frequency of the digitally programmable analog filter between at least two filter frequencies to perform at least first and second measurements of the signal at the output of the analog-to-digital converter, and the digital calibration circuit adjusts the filter frequency based on the first and second measurements. Therefore, the system can be configured to automatically calibrate the filter to a desired setting (e.g., setting the filter to attenuate the signal by 3 dB at a particular frequency).

Figure 2:
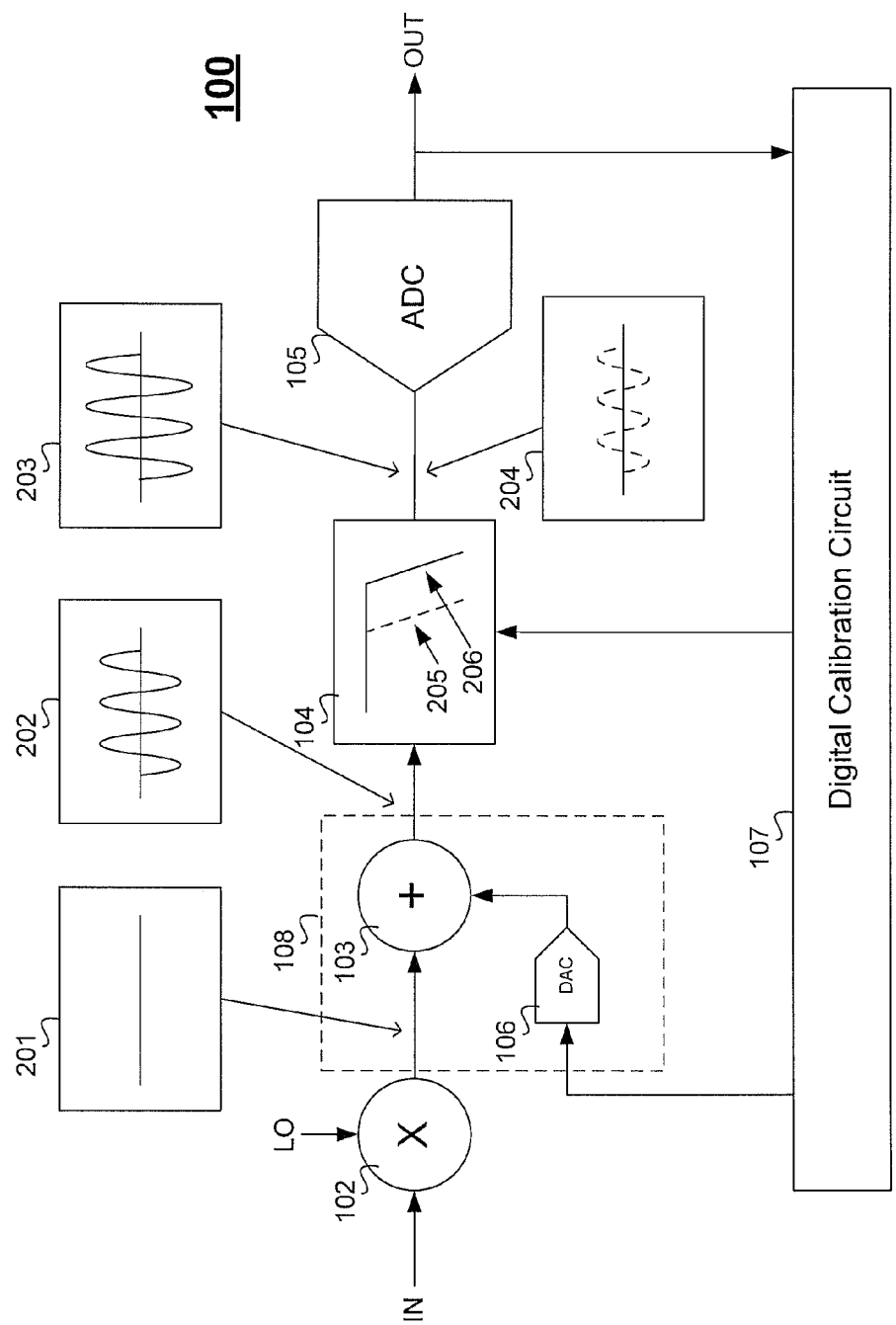
FIG. 2 illustrates the circuit of FIG. 1 and corresponding example waveforms according to one embodiment of the present invention.

FIG. 2 illustrates the circuit 100 of FIG. 1 and corresponding example waveforms 201-204 according to one embodiment of the present invention. Waveform 201 illustrates that no AC signal is provided from mixer 102 during calibration. Digital calibration circuit 107 uses DC compensation circuit 108 to generate the AC signal which is illustrated by waveform 202. Analog filter 104 can be adjusted to filter frequency 206 during a first calibration phase to produce waveform 203, which is subsequently converted to digital signal OUT by ADC 105. During the first calibration phase, digital calibration circuit 107 uses digital signal OUT to determine a magnitude or peak-to-peak value, for example, to represent waveform 203 and save this reference value. Frequency response 206 can be set to a filter frequency that is greater than the frequency of the signal so that the signal is in the pass band of the filter, for example.

During a second calibration phase, digital calibration circuit 107 adjusts analog filter 104 to a second filter frequency illustrated by 205. This adjustment can be a first estimate of the desired or target frequency response, and may result in waveform 204. In this example, waveform 204 has been attenuated because the filter frequency is now approximately equal to the frequency of signal 202. ADC 105 converts waveform 204 to digital signal OUT, and digital calibration circuit 107 determines a magnitude or peak-to-peak value, for example, of waveform 204. Digital calibration circuit 107 adjusts the filter frequency of the digitally programmable analog filter 104 based on the measured values of waveform 203 and 204. In one embodiment, the target frequency response may correspond to a corner frequency having 3 dB attenuation at a desired frequency, for example.

Figure 3A:
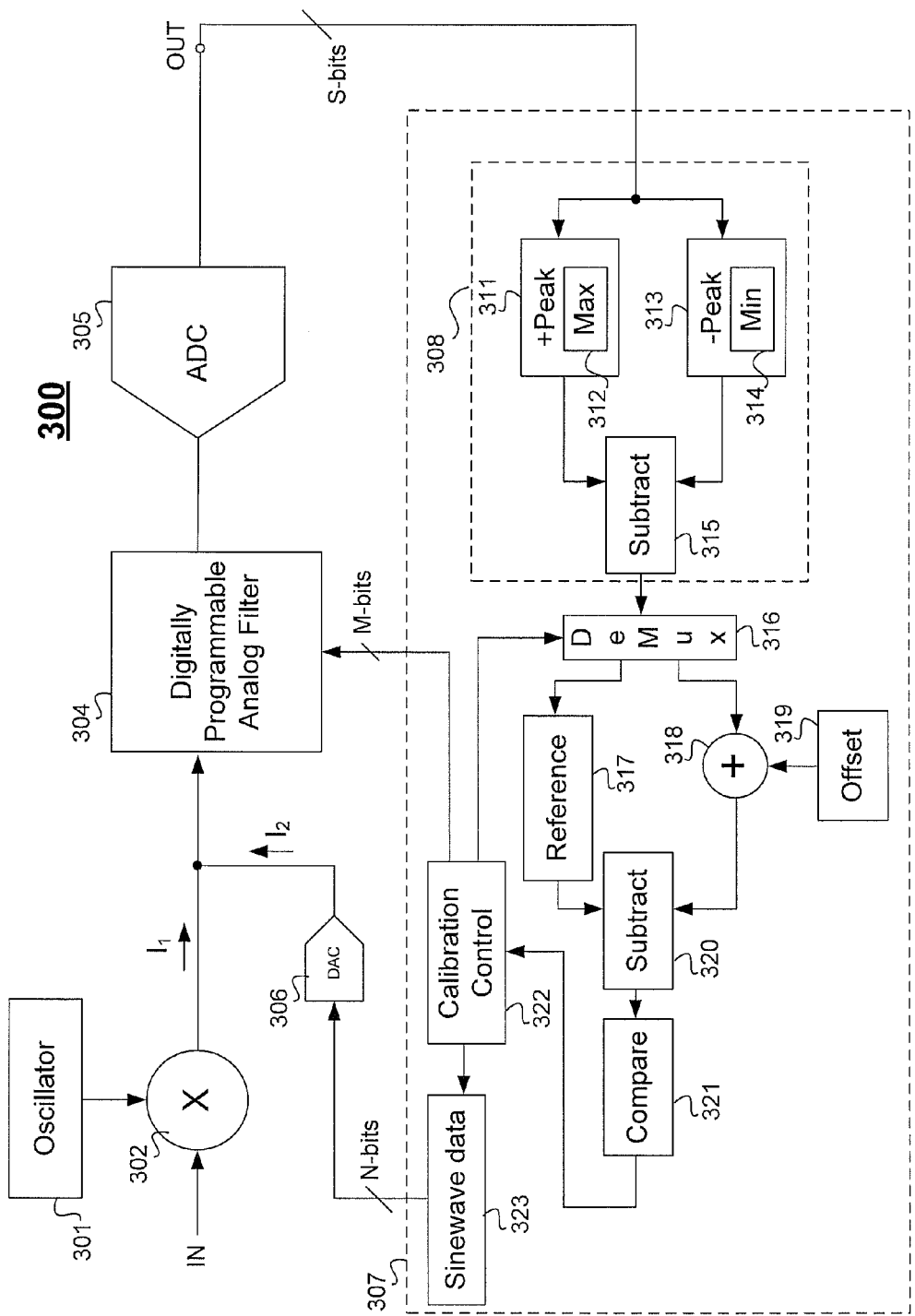
FIG. 3A illustrates a circuit according to another embodiment of the present invention.

FIG. 3A illustrates a circuit 300 according to another embodiment of the present invention. Circuit 300 includes oscillator 301, mixer 302, analog filter 304, ADC 305, DAC 306, and digital calibration circuit 307. Analog filter 304 can be a digitally programmable analog filter as mentioned above. In this embodiment, the signal at the input of analog filter 304 is a current, which is coupled to an analog input of the filter from an output of current DAC 306. In one embodiment, the resulting digital signal OUT is an S-bit signal, where S is an integer, that is processed by digital calibration circuit 307 to determine peak values.

During normal operation of circuit 300, mixer 302 provides current to analog filter 304, and DAC 306 receives a digital signal and provides another current $I_2$ to produce a DC voltage level. However, during calibration, a calibration routine may be running and current $I_1$ may be equal to a DC current or zero (e.g., the mixer may be turned off or configured in a high impedance output state). Oscillator 301 may also be turned off, for example.

In calibration mode, DAC 306 can function similar to DAC 106 of FIG. 1. In this embodiment, digital calibration circuit 307 includes a calibration control 322 that provides instructions for sine wave data generator 323 to provide an N-bit digital representation of a sine wave signal (e.g., 6-bits) to DAC 306 such that DAC 306 provides an AC current signal $I_2$ to the input terminal of analog filter 304.

Calibration control 322 can also provide a digital input (M-bits wide) to adjust the filter frequency of analog filter 304. During a first calibration phase, the filter frequency (e.g., the 3 dB frequency) of analog filter 304 can be set at a frequency that is greater than the frequency of current signal $I_2$. The resulting digital signal OUT can have a first peak-to-peak value as determined by the gain or attenuation of the pass band of the filter (e.g., a gain of 1). During a second calibration phase, the filter frequency (e.g., the 3 dB frequency) of analog filter 304 can be set at a frequency that is approximately equal to the frequency of current signal $I_2$. The resulting digital signal OUT can have a second peak-to-peak value, which may be attenuated according to how close, in frequency, the current signal is to the filter frequency. A comparison of the first and second peak-to-peak values can be used to determine subsequent frequency adjustments of analog filter 304. For example, if 3 dB is the target filter frequency, the filter frequency can be increased if the attenuation is too great (i.e., the frequency of the current signal is above the 3 dB frequency of the filter) or the filter frequency can be decreased if the attenuation is too small (i.e., the frequency of the current signal is below the 3 dB frequency of the filter).

Digital calibration circuit 307 can use a digital peak detector to determine the attenuation of the signal based on different filter frequencies. Digital peak detector 308 illustrates one example of a peak detector that can be used. Peak detector 308 includes +peak detector 311, −peak detector 313, a max storage 312, a min storage 314, and a subtraction block 315. Digital peak detector 308 successively compares each sample value of digital signal OUT with the present high peak value and the present low peak value to determine if either value may be updated, and a difference between the present high peak value and the present low peak value can be used to successively calculate a peak-to-peak value.

For example, +peak detector 311 compares each incoming sample value to a present high peak value stored in max storage 312 to determine which is greater. If the received sample value is less than the present high peak value, then the present high peak value is updated by storing the sample value in max storage 312, and if the sample value is greater than or equal to the present high peak value, the present high peak value remains in max storage 312.

Similarly, −peak detector 313 compares each sample value to a present low peak value stored in min storage 314 to find a low peak (e.g., using an absolute value). If the received sample value is greater than or equal to the present low peak value (e.g., in magnitude), then the present low peak value is updated by storing the sample value in min storage 314, and if the magnitude of the received sample value is less than the present low peak value, then the present low peak value remains in min storage 314.

Subtraction block 315 successively calculates the peak-to-peak value. The present low peak value is subtracted from the present high peak value to calculate the present peak-to-peak value. In some embodiments, 15 cycles of the analog output signal represented by digital signal OUT may be needed to get an acceptably accurate present peak-to-peak value.

Calibration control 322 also controls demux 316. During a first calibration phase, demux 316 is set to update reference storage 317 with a reference value corresponding to the present peak-to-peak value. This value corresponds to the output of the filter when programmed to a first frequency (e.g., such that the input signal frequency is in the pass band of the filter). During a second calibration phase, demux 316 is set such that the received peak-to-peak value (e.g., of the attenuated input signal) is coupled through an adder 318 that adds an offset value from offset storage 319 to the present peak-to-peak value. The offset may be a 3 dB offset, so that when the filter is at precisely the desired 3 dB frequency, which may also be the frequency of the input signal, the first measured peak-to-peak value will match the subsequently measured peak-to-peak value. The offset may also represent a gain or attenuation in the pass band of the filter, but for simplicity the pass band may be considered unity gain, for example. The offset value may further represent a 3 dB offset plus any errors associated with ripple in the pass band of analog filter 304 and/or a frequency offset of the AC current signal $I_2$. The frequency offset of the AC current signal $I_2$ may be due to the finite frequency steps which may be generated by the digital calibration circuit 307. If the AC current input signal is offset in frequency from the desired 3 dB frequency, for example, the corresponding attenuation resulting from the output of analog filter 304 will also be skewed by some factor. This factor can be added or subtracted as an error in offset 319 to improve the calibration. In one example implementation, the offset is 3.8 dB. 3 dB is due to the attenuation at the target corner frequency. 0.8 dB is due to error factors such as ripple in the pass band and from the fact that 419 kHz is used rather than the target calibration corner frequency of 400 kHz.

Subtraction block 320 subtracts the reference value from the present peak-to-peak value plus the offset value. The result of subtraction block 320 is sent to compare block 321 to extract the sign of the calculation. The sign of the calculation is used by calibration control 322 to further adjust the filter frequency of analog filter 304 such that the present peak-to-peak value plus the offset value is equal to the reference value or as close to the reference value as the DAC may provide. As an example, if the comparison is negative, the initial measurement (i.e., signal frequency in filter pass band) may be less than the later measurement, indicating that the filter frequency may need to be decreased to further attenuate the reference signal. Alternatively, if the comparison is positive, the initial measurement may be greater than the later measurement, indicating that the filter frequency may need to be increased to reduce attenuation of the reference signal.

Figure 3B:
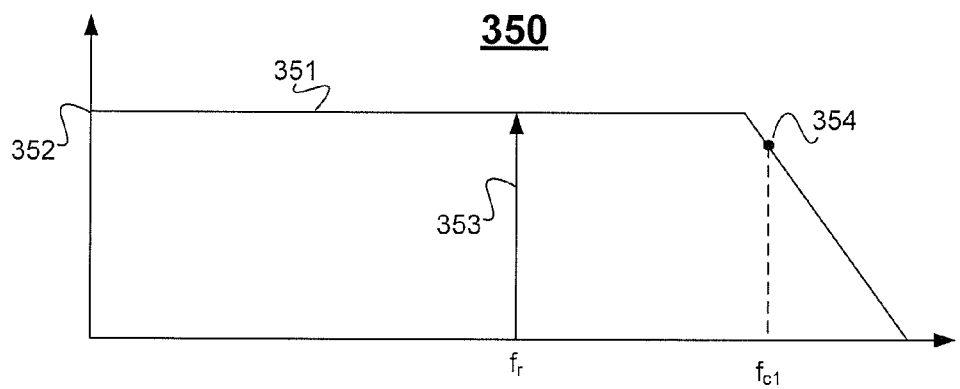
FIG. 3B illustrates example frequency response graphs corresponding to the circuit of FIG. 3A.
Figure 3B:
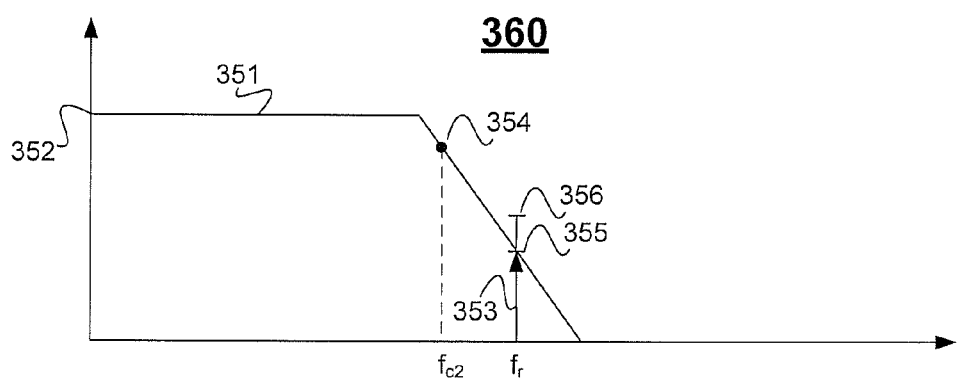
Figure 3B:
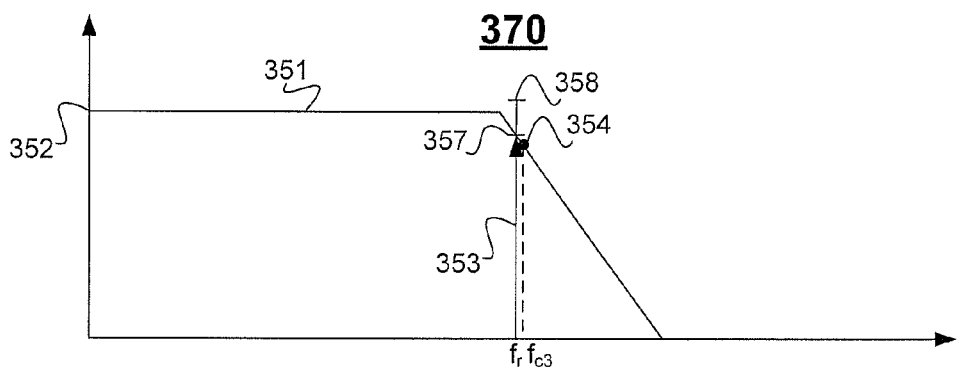

FIG. 3B illustrates example frequency response graphs 350, 360, and 370 corresponding to the circuit of FIG. 3A. Graph 350 shows a frequency response during a portion of the first calibration phase in which analog filter 304 is adjusted to a filter frequency $f_{c1}$ which forms a pass band 351 having level 352 for AC signal 353. A 3 dB (i.e., half power) point 354 corresponds to filter frequency $f_{c1}$. During this first calibration phase the peak-to-peak value may be saved as a reference level corresponding to level 352 of AC signal 353 within the pass band 351.

Graph 360 shows a frequency response during a portion of the second calibration phase in which the analog filter 304 is adjusted to an estimate of a target filter frequency $f_r$. The actual frequency may be filter frequency $f_{c2}$ 354, where filter frequency $f_{c2}$ corresponds to the 3 dB point. The frequency response of analog filter 304 of FIG. 3A attenuates AC signal 353 to level 355. An offset value can be added to the level 355 to make the comparison level 356. The offset value can include 3 dB plus any error correction factors (e.g., ripple in the pass band or digital frequency quantization errors). Graph 360 indicates that level 356 is less than level 352. In this case, calibration control 322 can increase the filter frequency. In one embodiment, the frequency is adjusted using a search routine such as a binary search within a window of frequency settings, for example.

Graph 370 shows a frequency response during a portion of a third calibration phase where successive measurements of the signal are performed. The search routine used in the second calibration phase ended with the filter frequency at frequency $f_{c3}$. 3 dB point 354 corresponds to filter frequency $f_{c3}$ and is close to level 357 of AC signal 353 such that comparison level 358 is slightly greater then level 352 (as shown). In this case, the calibration routine can begin a second search routine such as a linear search, for example. The filter frequency can be decreased in steps until comparison level 358 becomes less than or equal to level 352.

The following are example estimates of sources of error for one example embodiment. In this embodiment, ADC 305 is a decimating sigma-delta ADC which utilizes a sinc filter. This may result in a 0.35% amplitude measurement error when to the AC current signal $I_2$ utilizes a clock source with a fixed phase relationship with the sine filter clock. The quantization error in the hardware may be less than 0.1%. The amplitude quantization error may be 0.33% for the AC current signal amplitude (e.g., for amplitude>2×300 LSB) and 0.5% for the calibration amplitude (e.g., for amplitude>2×200 LSB) at the target calibration corner frequency where the signal is attenuated. Also, a 1% error may be due to higher frequency harmonics that are in the pass band during the reference amplitude measurement. The total ratio measurement precision may be better than 2.28% (0.35+0.1+0.33+0.5+1.0=2.28).

For this example, the target offset may be −3.8 dB attenuation. For the region of the frequency response having a −3.8 dB attenuation, the gain/frequency slope may be approximately −1.5 dB/dB. This means a 1% error in amplitude results in a 0.66% error in frequency. Thus for this example, a 2.28% error in amplitude measurement results in a 1.5% frequency error.

Figure 4:
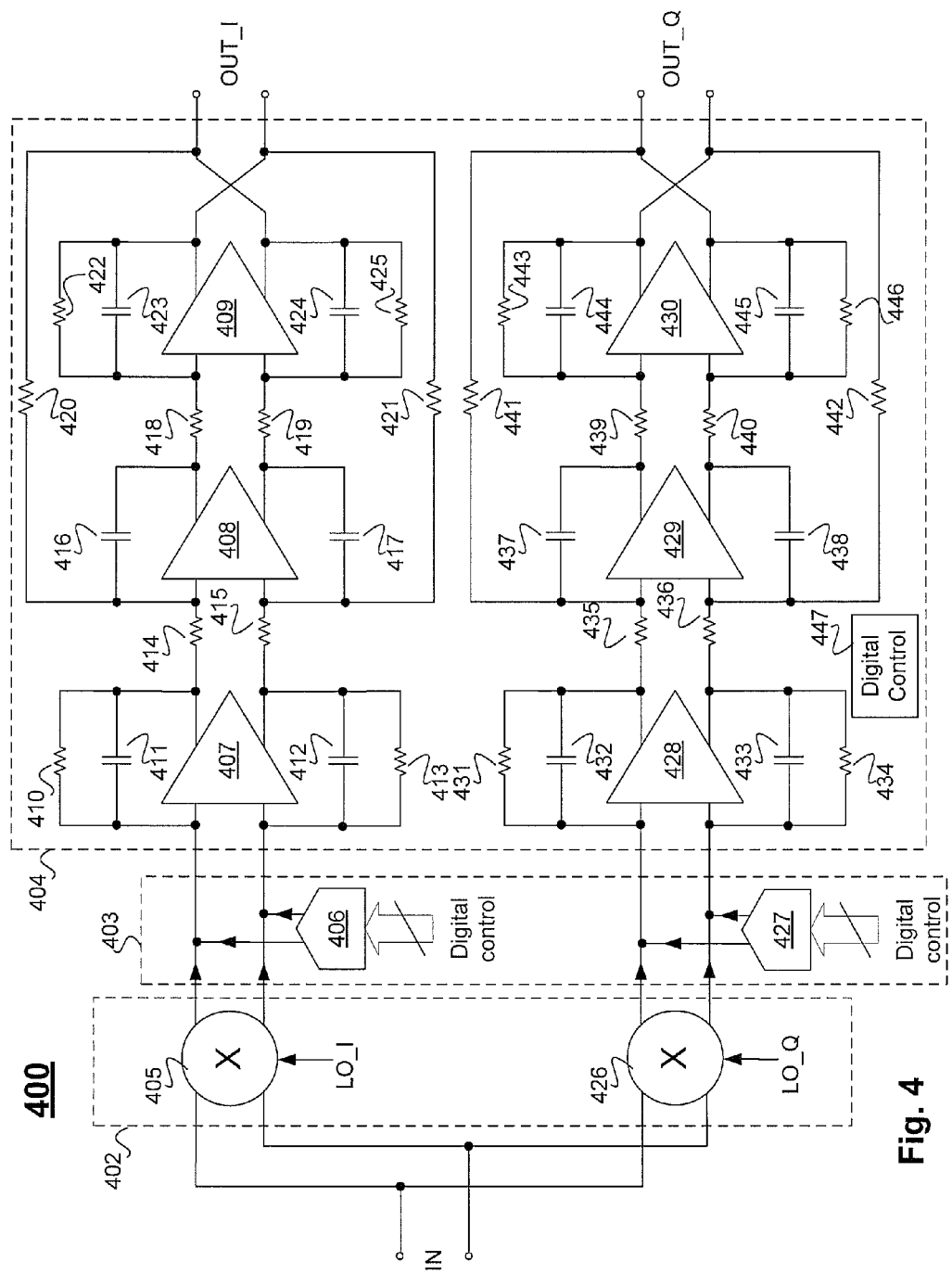
FIG. 4 illustrates a circuit according to one embodiment of the present invention.

FIG. 4 illustrates a circuit 400 according to one embodiment of the present invention. Circuit 400 includes mixer 402 coupled to analog filter 404. DC compensation circuit 403 is coupled between mixer 402 and analog filter 404. DC compensation circuit 403 can be used to generate a differential quadrature AC signal to calibrate analog filter 404.

Mixer 402 is a differential quadrature mixer having differential inphase mixer 405 and differential quadrature mixer 426. Both mixers take in differential signal IN. Differential inphase mixer 405 has a local oscillator LO_I input and differential quadrature mixer 426 has a local oscillator LO_Q input. Both mixers output differential currents during a first (normal) mode of operation. During the alternate (calibration) mode, the currents from mixer 402 are negligible and the mixer may present a high impedance output, for example.

DC compensation circuit 403 includes differential DAC 406 coupled to the differential output of differential inphase mixer 405 and differential DAC 427 coupled to the differential output of differential quadrature mixer 426. Both differential DAC 406 and differential DAC 427 receive digital control signals from a digital calibration circuit (not shown) to generate a differential AC signal for the differential inphase input of analog filter 404 and a differential AC signal for the differential quadrature input of analog filter 404.

Analog filter 404 is a differential quadrature 3rd order Butterworth filter that is digitally programmable. Analog filter 404 has an inphase circuit path and a quadrature circuit path which are similar. The inphase circuit path includes differential amplifiers 407-409 coupled in series. Differential programmable resistor pair 414-415 is coupled between differential amplifier 407 and 408. Resistor pair 418-419 is coupled between differential amplifiers 408 and 409.

Differential amplifier 407 has capacitor 411 and resistor 410 coupled between a first input and a first output. Capacitor 412 and resistor 413 are coupled between a second input and a second output of differential amplifier 407. Differential amplifier 408 has capacitor 416 coupled between a first input and a first output. Capacitor 417 is coupled between a second input and a second output of differential amplifier 408. Differential amplifier 409 has capacitor 423 and resistor 422 coupled between a first input and a first output. Capacitor 424 and resistor 425 are coupled between a second input and a second output of differential amplifier 409. Resistor 420 couples the first input of differential amplifier 408 to the second output of differential amplifier 409. Resistor 421 couples the second input of differential amplifier 408 to the first output of differential amplifier 409.

The quadrature circuit path is similar to the inphase circuit path. Differential amplifiers 407-409, resistor 410, capacitors 411-412, resistors 413-415, capacitors 416-417, resistors 418-422, capacitors 423-424, and resistor 425 correspond to differential amplifiers 428-430, resistor 431, capacitors 432-433, resistors 434-436, capacitors 437-438, resistors 439-443, capacitors 444-445, and resistor 446. The filter frequency is controlled by digital control 447 programming capacitors 411, 412, 416, 417, 423, 424, 432, 433, 437, 438, 444 and 445. Accordingly, these capacitors may be programmable capacitor banks, for example.

Figure 5:
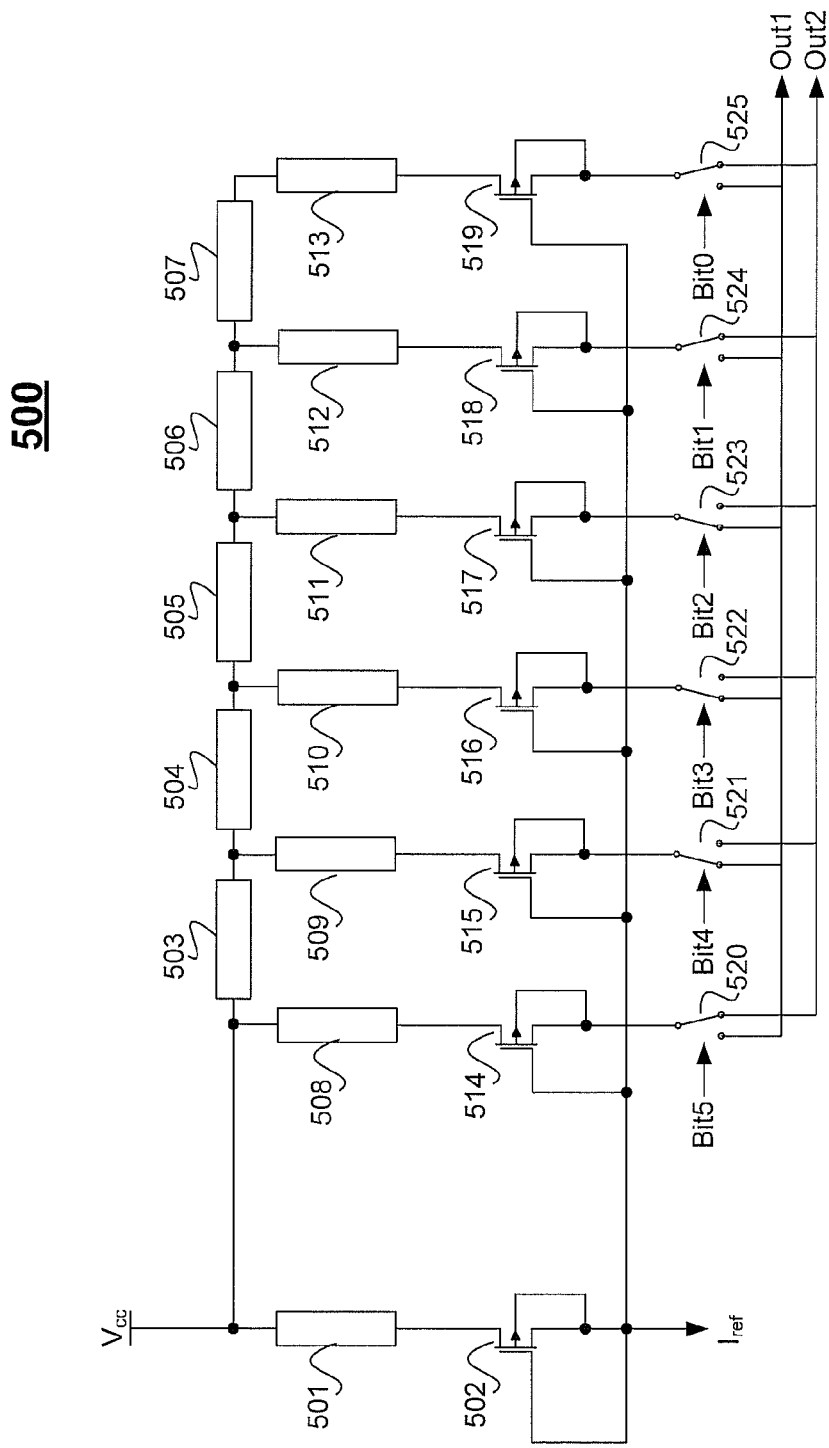
FIG. 5 illustrates digital-to-analog circuit according to one embodiment of the present invention.

FIG. 5 illustrates digital-to-analog (DAC) circuit 500 according to one embodiment of the present invention. DAC circuit 500 may be used as DAC 406 and DAC 427 of circuit 400 of FIG. 4. DAC circuit 500 includes resistors 503-513 coupled as a resistor ladder network having one end coupled to reference voltage $V_{cc}$ and the tap ends coupled to a plurality of metal oxide semiconductor (MOS) transistors (514-519). The gate terminals of transistors 514-519 are coupled to the gate terminal of transistor 502. Transistor 502 is coupled as a diode with a current $I_{ref}$, resistor 501, and reference voltage $V_{cc}$ setting up a control voltage at the gate terminal of all of the transistors (502, 514-519). The resistor ladder network and the control voltage sets up a plurality of weighted currents which can be switched between a differential input (Out1 and Out2) by a plurality of switches 520-525. Switch 525 can switch the least significant current and is controlled by least significant bit Bit0. The switches are in an example position showing 011100b.

Figure 6:
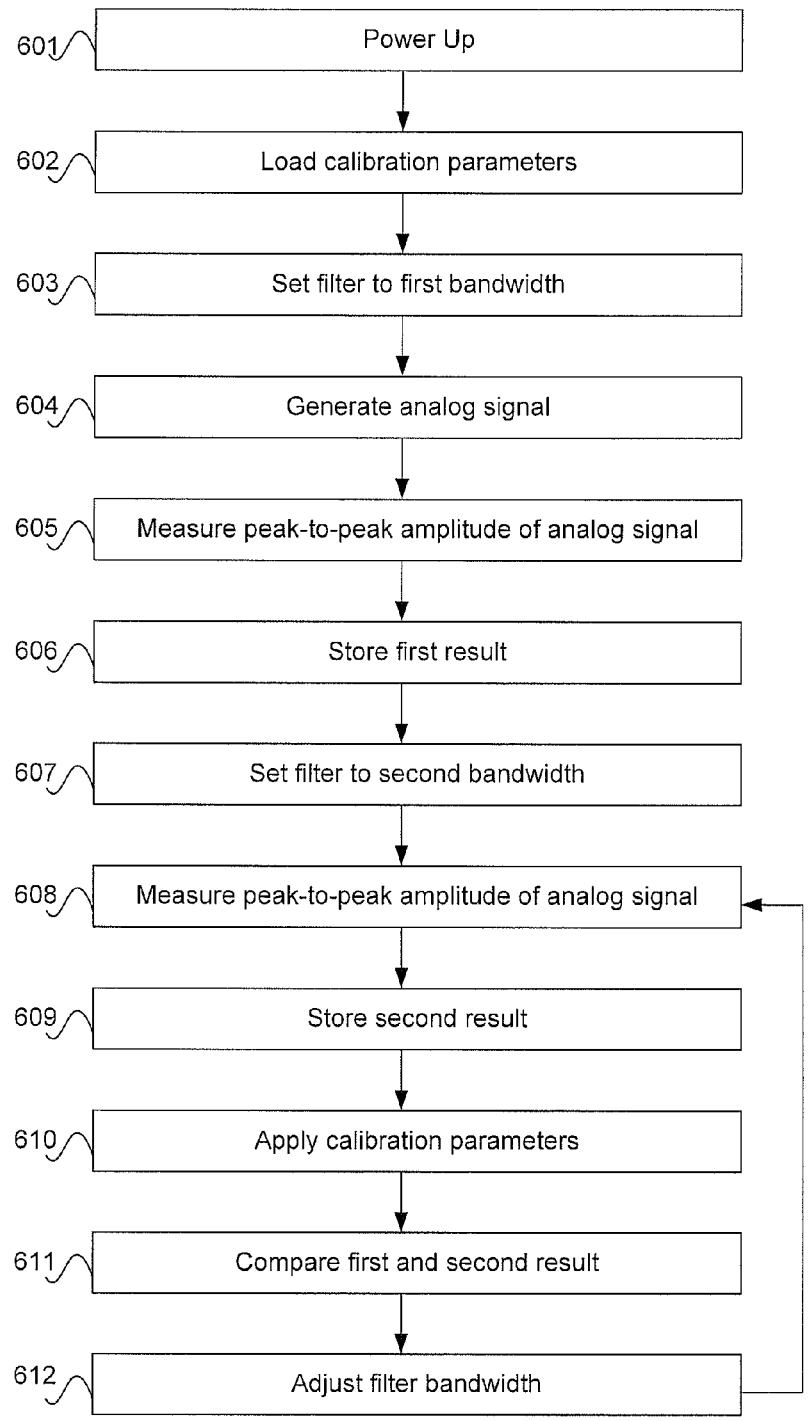
FIG. 6 illustrates a method according to one embodiment of the present invention.

FIG. 6 illustrates a method 600 according to one embodiment of the present invention. At 601, the circuit is powered up. At 602, the calibration parameters are loaded. This has been discussed above. At 603, the filter is set to a first bandwidth. This may correspond to the corner frequency as discussed above. The filter can be a digitally programmable analog filter. At 604, an AC analog signal is generated using a DC compensation circuit. The corner frequency of 603 may create a pass band for the AC analog signal generated such that minimal attenuation occurs through the filter. At 605, the peak-to-peak amplitude of the analog signal is measured. This amplitude can be measured successively as discussed above. At 606, the first result is stored.

At 607, the filter is set to a second bandwidth. This may be a first estimation of the bandwidth that would correspond to the frequency of the AC analog signal. At 608, the peak-to-peak amplitude of the analog signal is measured. At 609, the second result is stored. At 610, the calibration parameters are applied. These parameters can adjust an offset to adjust for errors as discussed above. At 611, the first and second results are compared according to the calibration parameters. At 612, the filter bandwidth is adjusted according to a result of 611. This adjustment may be part of a search method such as a linear or binary search, for example. The process may further include a stop criteria, for example. During the calibration process, the system may need to stop based on certain conditions being met, which indicate that the calibration is complete. For a binary search, for example, the filter frequency settings may be changed from MSB to LSB. The stop criterion can then be that the LSB bit value has been set. In linear search the stop criterion may be that the direction of the filter adjustment changes. Again the method repeats 608-612 to search for a filter bandwidth that corresponds to the frequency of the AC analog signal generated.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. For example, one or more steps of methods or processes discussed above may be performed in a different order (or concurrently) and still achieve desirable results. Based on the above disclosure and the following claims, other arrangements, embodiments, implementations and equivalents may be employed without departing from the scope of the invention as defined by the claims.

What is claimed is:

1. An integrated circuit comprising:
   a communication channel comprising a digitally programmable analog filter and an analog-to-digital converter coupled in series, the digitally programmable analog filter having a filter frequency;
   a digital calibration circuit to
      generate a digital signal;
      change the filter frequency of the digitally programmable analog filter between at least two filter frequencies to perform at least a first measurement and a second measurement of a first signal at an output of the analog-to-digital converter; and
      adjust the filter frequency of the digitally programmable analog filter based on the first measurement and the second measurement; and
   a digital-to-analog converter to receive the digital signal from the digital calibration circuit; and generate the first signal having a first frequency and couple the first signal to an analog input of the digitally programmable analog filter, wherein, during calibration, the digital-to-analog converter generates the first signal, and wherein, during normal operation of the communication channel, the digital-to-analog converter produces a digitally controlled DC voltage level.

2. An integrated circuit comprising:

a communication channel comprising a digitally programmable analog filter and an analog-to-digital converter coupled in series, the digitally programmable analog filter having a filter frequency; and a digital calibration circuit to generate a first signal coupled to an analog input of the digitally programmable analog filter;

change the filter frequency of the digitally programmable analog filter between at least two filter frequencies to perform at least a first measurement and a second measurement of the first signal at an output of the analog-to-digital converter; and adjust the filter frequency of the digitally programmable analog filter based on the first measurement and the second measurement, wherein the at least two filter frequencies include a first filter frequency and a second filter frequency;

during a first calibration phase, the first filter frequency is greater than a first frequency of the first signal; and during a second calibration phase, the second filter frequency is approximately equal to the first frequency of the first signal.

3. The integrated circuit of claim 1, wherein the calibration circuit further comprises a peak detector.

4. The integrated circuit of claim 1, further comprising a plurality of additional measurements, wherein the filter frequency is adjusted using a search algorithm.

5. An integrated circuit comprising:

a communication channel comprising a digitally programmable analog filter and an analog-to-digital converter coupled in series, the digitally programmable analog filter having a filter frequency; and a digital calibration circuit to generate a first signal coupled to an analog input of the digitally programmable analog filter;

change the filter frequency of the digitally programmable analog filter between at least two filter frequencies to perform at least a first measurement and a second measurement of the first signal at an output of the analog-to-digital converter; and adjust the filter frequency of the digitally programmable analog filter based on the first measurement and the second measurement, wherein the digital calibration circuit adjusts the filter frequency to reduce the first signal by 3 dB.

6. An integrated circuit comprising:

an RF communication channel, the RF communication channel comprising:

a mixer, a digitally programmable analog filter having an analog input terminal coupled to an output terminal of the mixer; and an analog-to-digital converter having an input terminal coupled to an analog output terminal of the digitally programmable analog filter;

a digital calibration circuit having an input coupled to an output of the analog-to-digital converter, a first output coupled to the analog input terminal of the digitally programmable analog filter, and a second output coupled to a digital input of the digitally programmable analog filter to change the filter frequency of the digitally programmable analog filter, the digital calibration circuit providing a first signal having a first frequency to the analog input terminal of the digitally programmable analog filter, wherein, during a first calibration phase, the digital calibration circuit configures the digitally programmable analog filter to a first filter frequency greater than the first frequency of the first signal and performs a first measurement of the first signal at the output of the analog-to-digital converter, wherein, during a second calibration phase, the digital calibration circuit configures the digitally programmable analog filter to a second filter frequency approximately equal to the first frequency of the first signal and performs a second measurement the first signal at the output of the analog-to-digital converter, and wherein the digital calibration circuit adjusts the second filter frequency based on the first measurement and the second measurement.

7. The integrated circuit of claim 6, further comprising a digital-to-analog converter to:

receive a digital representation of the first signal from the digital calibration circuit; and generate an analog representation of the first signal having the first frequency.

8. The integrated circuit of claim 7, wherein:

during calibration, the digital-to-analog converter generates the first signal; and during normal operation of the communication channel, the digital-to-analog converter produces a digitally controlled DC voltage level.

9. The integrated circuit of claim 8, wherein the digital-to-analog converter generates at least one output current to the analog input terminal of the digitally programmable analog filter.

10. The integrated circuit of claim 6, wherein the digital calibration circuit includes a peak detector.

11. The integrated circuit of claim 10, further comprising memory, wherein a first peak value, corresponding to the first signal, is stored in the memory during the first calibration phase, and wherein the stored first peak value is used as a reference value in the second calibration phase.

12. A method comprising:

configuring a digital calibration circuit to generate a digital representation of a first signal;

converting the digital representation the first signal from the digital calibration circuit into an analog representation of the first signal, the analog representation of the first signal being coupled to an analog input of the digitally programmable analog filter in a communication channel of an integrated circuit, wherein the digitally programmable analog filter is coupled in series with an analog-to-digital converter;

changing a filter frequency of the digitally programmable analog filter between at least two filter frequencies to perform at least a first measurement and a second measurement of the first signal at an output of the analog-to-digital converter; and adjusting the filter frequency based on the first measurement and the second measurement.

13. The method of claim 12, wherein:
during calibration, the digital-to-analog converter generates the analog representation of the first signal; and
during normal operation of the communication channel, providing a digitally controlled DC voltage level.

14. A method comprising:
configuring a digital calibration circuit to generate a first signal, the first signal being coupled to an analog input of the digitally programmable analog filter in a communication channel of an integrated circuit, wherein the digitally programmable analog filter is coupled in series with an analog-to-digital converter;
changing a filter frequency of the digitally programmable analog filter between at least two filter frequencies to perform at least a first measurement and a second measurement of the first signal at an output of the analog-to-digital converter; and
adjusting the filter frequency based on the first measurement and the second measurement,
wherein
the at least two filter frequencies include a first filter frequency and a second filter frequency;
during a first calibration phase, the first filter frequency is greater than a first frequency of the first signal; and
during a second calibration phase, the second filter frequency is approximately equal to the first frequency of the first signal.

15. A method comprising:
configuring a digital calibration circuit to generate a first signal, the first signal being coupled to an analog input of the digitally programmable analog filter in a communication channel of an integrated circuit, wherein the digitally programmable analog filter is coupled in series with an analog-to-digital converter;
changing a filter frequency of the digitally programmable analog filter between at least two filter frequencies to perform at least a first measurement and a second measurement of the first signal at an output of the analog-to-digital converter;
adjusting the filter frequency based on the first measurement and the second measurement; and
detecting, by the digital calibration circuit, first and second peaks of the first signal.

16. The method of claim 12, further comprising a plurality of additional measurements at a plurality of filter frequencies, wherein the filter frequency is adjusted using a search algorithm.

17. A method comprising:
configuring a digital calibration circuit to generate a first signal, the first signal being coupled to an analog input of the digitally programmable analog filter in a communication channel of an integrated circuit, wherein the digitally programmable analog filter is coupled in series with an analog-to-digital converter;
changing a filter frequency of the digitally programmable analog filter between at least two filter frequencies to perform at least a first measurement and a second measurement of the first signal at an output of the analog-to-digital converter; and
adjusting the filter frequency based on the first measurement and the second measurement,
wherein the digital calibration circuit adjusts the filter frequency to reduce the first signal by 3 dB.

\* \* \* \* \*